United States Patent
Hu et al.

(10) Patent No.: US 11,424,383 B2
(45) Date of Patent: *Aug. 23, 2022

(54) SEMICONDUCTOR DEVICE

(71) Applicant: EPISTAR CORPORATION, Hsinchu (TW)

(72) Inventors: Tzu-Chieh Hu, Hsinchu (TW); Wei-Chieh Lien, Hsinchu (TW); Chen Ou, Hsinchu (TW); Chia-Ming Liu, Hsinchu (TW); Tzu-Yi Chi, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/076,511

(22) Filed: Oct. 21, 2020

(65) Prior Publication Data
US 2021/0057603 A1 Feb. 25, 2021

Related U.S. Application Data

(63) Continuation of application No. 16/196,793, filed on Nov. 20, 2018, now Pat. No. 10,818,818.
(Continued)

(51) Int. Cl.
*H01L 33/00* (2010.01)
*H01L 33/14* (2010.01)
(Continued)

(52) U.S. Cl.
CPC ........ *H01L 33/0025* (2013.01); *H01L 33/025* (2013.01); *H01L 33/12* (2013.01);
(Continued)

(58) Field of Classification Search
CPC ..... H01L 33/0025; H01L 33/12; H01L 33/14; H01L 33/325; H01L 33/007; H01L 33/38; H01L 33/42
See application file for complete search history.

(56) References Cited

U.S. PATENT DOCUMENTS 5,696,389 A 12/1997 Ishikawa et al.
2012/0319162 A1 12/2012 Araki et al.
(Continued)

FOREIGN PATENT DOCUMENTS

CN 100454592 C 1/2009
CN 102194934 A1 9/2011
(Continued)

OTHER PUBLICATIONS

Toru Sugiyama et al., "Extremely Low-Resistivity and High-Carrier Concentration Si-Doped Al0.05Ga0.95N", published at Applied Physics Express 6 (2013) 121002, 4 pages.

*Primary Examiner* — Fernando L Toledo
*Assistant Examiner* — Neil R Prasad
(74) *Attorney, Agent, or Firm* — Ditthavong, Steiner & Mlotkowski

(57) ABSTRACT

A semiconductor device includes: a first semiconductor region; and a first electrode on the first semiconductor region; wherein first semiconductor region includes a first layer and a second layer, the second layer includes a first portion and a second portion adjacent to the first portion, the first portion has a first thickness, the second portion has a second thickness less than the first thickness, the first layer includes a first material and a first dopant, the first material includes multiple elements, the first dopant has a first concentration, the second layer includes a second material and a second dopant, the second material includes multiple elements, the second dopant has a second concentration, one of the elements of the first material of the first layer is different from the elements of the second material of the second layer.

20 Claims, 3 Drawing Sheets

Related U.S. Application Data

(60) Provisional application No. 62/592,863, filed on Nov. 30, 2017.

(51) Int. Cl.
*H01L 33/12* (2010.01)
*H01L 33/32* (2010.01)
*H01S 5/00* (2006.01)
*H01L 33/02* (2010.01)
*H01L 33/38* (2010.01)
*H01L 33/42* (2010.01)

(52) U.S. Cl.
CPC ............ *H01L 33/14* (2013.01); *H01L 33/325* (2013.01); *H01S 5/00* (2013.01); *H01L 33/007* (2013.01); *H01L 33/38* (2013.01); *H01L 33/42* (2013.01)

(56) References Cited

U.S. PATENT DOCUMENTS

| | | |
|---|---|---|
| 2015/0270436 A1 | 9/2015 | Han et al. |
| 2017/0098736 A1 | 4/2017 | Lee et al. |
| 2018/0248071 A1 | 8/2018 | Jain et al. |

FOREIGN PATENT DOCUMENTS

| | | |
|---|---|---|
| CN | 103066176 A | 4/2013 |
| JP | 3767491 B2 | 4/2006 |
| JP | 2008078563 A | 4/2008 |

SEMICONDUCTOR DEVICE

TECHNICAL FIELD

The disclosure relates to a semiconductor device, and particularly to a semiconductor device including a first semiconductor region including a first layer and a second layer.

CROSS REFERENCE TO RELATED APPLICATIONS

This application claims the benefit of U.S. patent application Ser. No. 16/196,793, filed on Nov. 20, 2018, now U.S. Pat. No. 10,818,818, which claims priority to U.S. Provisional Application Ser. No. 62/592,863, filed on Nov. 30, 2017, the entire contents of which are hereby incorporated by reference.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a semiconductor device. The semiconductor device includes: a first semiconductor region; a second semiconductor region on the first semiconductor region; an active region between the second semiconductor region and the first semiconductor region; and a first electrode on the first semiconductor region; wherein first semiconductor region includes a first layer and a second layer between the first layer and the active region, the second layer includes a first portion and a second portion adjacent to the first portion, the first portion is overlapped with the active region in a stacking direction and has a first thickness, the second portion has a second thickness less than the first thickness, the first layer includes a first material and a first dopant, the first material includes multiple elements, the first dopant has a first concentration, the second layer includes a second material and a second dopant, the second material includes multiple elements, the second dopant has a second concentration, one of the elements of the first material of the first layer is different from the elements of the second material of the second layer, the first concentration of the first dopant of the first layer is greater than the second concentration of the second dopant of the second layer, and the first electrode is on the second portion of the second layer.

The present disclosure provides a semiconductor device. The semiconductor device includes: a first semiconductor region; a second semiconductor region on the first semiconductor region; an active region between the second semiconductor region and the first semiconductor region; a spacer layer between the first semiconductor region and the active region, wherein the spacer layer includes a first intermediate layer and a second intermediate layer on the first intermediate layer, the first intermediate layer includes a dopant having a concentration, the second intermediate layer includes a dopant having a concentration, and the concentration of the dopant of the first intermediate layer is greater than the concentration of the dopant of the second intermediate layer; and a first electrode on the first semiconductor region; wherein first semiconductor region includes a first layer under the spacer layer; wherein the first layer includes a first dopant including a first concentration, and the first concentration is greater than the concentration of the dopant of the first intermediate layer.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
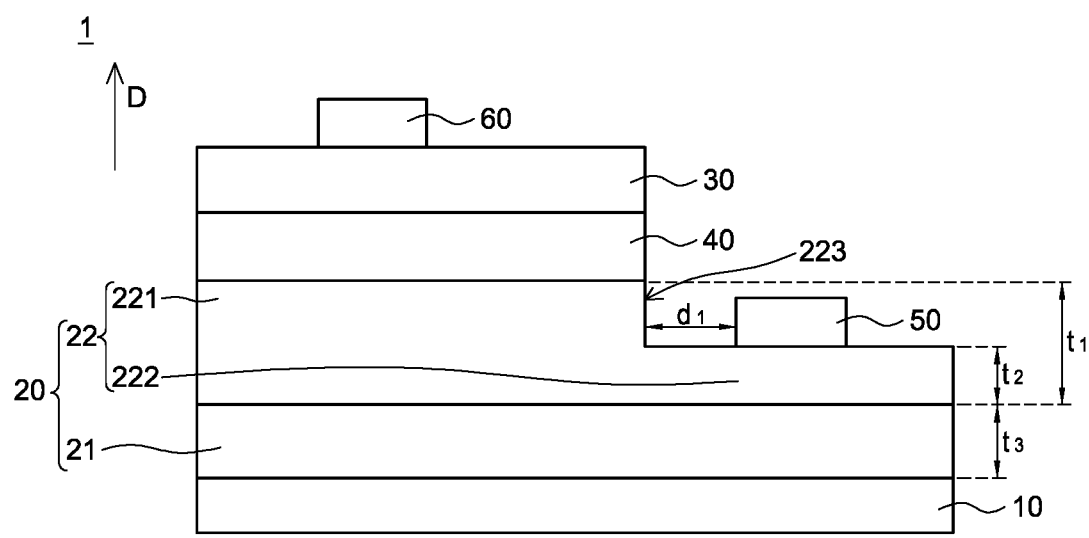
FIG. 1 is a schematic cross-sectional diagram of a first embodiment of a semiconductor device.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaN means $Al_{x1}Ga_{(1-x1)}N$, wherein $0 \le x1 \le 1$; the general expression of InGaN means $In_{x2}Ga_{1-x2}N$, wherein $0 \le x2 \le 1$; the general expression of InAlGaN means $In_{x3}Al_{y1}Ga_{1-x3-y1}N$, wherein $0 \le x3 \le 1$, $0 \le y1 \le 1$. The content of the element can be adjusted for different purposes, such as, but not limited to, adjusting the energy gap or the peak wavelength of the light emitted from the semiconductor device when the semiconductor device includes a light-emitting device.

In the following embodiments, wordings used to indicate directions, such as "up," "down," "front," "back," "left,", "on", 'under' and "right", merely refer to directions in the accompanying drawings. Therefore, the directional wording is used to illustrate rather than limit the present disclosure.

The compositions and dopants of each layer in the semiconductor device of the present disclosure can be determined by any suitable means, such as secondary ion mass spectrometer (SIMS).

The thickness of each layer in the semiconductor device of the present disclosure can be determined by any suitable means, such as transmission electron microscope (TEM) or scanning electron microscope (SEM) to determine the depth position of each layer on the SIMS graph.

The semiconductor device of the present disclosure includes a light-emitting device. The light-emitting device includes a light-emitting diode or a laser.

FIG. 1 is a schematic cross-sectional diagram of a first embodiment of a semiconductor device 1. In the present embodiment, the semiconductor device 1 includes a substrate 10, a first semiconductor region 20 on the substrate 10, a second semiconductor region 30 on the first semiconductor region 20, and an active region 40 between the second semiconductor region 30 and the first semiconductor region 20. The semiconductor device 1 further includes a first electrode 50 and a second electrode 60. The first electrode 50 is on the first semiconductor region 20 and is electrically connected to the first semiconductor region 20. The second electrode 60 is on the second semiconductor region 30 and is electrically connected to the second semiconductor region 30.

Referring to FIG. 1, the first semiconductor region 20 includes a first layer 21 and a second layer 22. The first layer 21 is between the substrate 10 and the active region 40. The second layer 22 is between the first layer 21 and the active region 40. The second layer 22 includes a first portion 221 and a second portion 222 adjacent to the first portion 221. The first portion 221 is overlapped with the active region 40 in a stacking direction D. The first electrode 50 is on the second portion 222 of the second layer 22 and is not overlapped with the first portion 221 of the second layer 22 in the stacking direction D. Specifically, the first electrode 50 is overlapped with the second portion 222 in the stacking direction D. The first portion 221 has a first thickness $t_1$. The second portion 222 has a second thickness $t_2$ less than the first thickness $t_1$. The first electrode 50 is closer to the second portion 222 than it is to the first layer 21. The first thickness $t_1$ is not less than 100 nm, and preferably, is not more than 1000 nm. Preferably, the first thickness $t_1$ is between 200 nm and 1000 nm. If the first thickness $t_1$ is greater than 1000 nm, the forward voltage of the semiconductor device 1 will be high. The second thickness $t_2$ is not less than 30 nm, and preferably, is not more than 400 nm. If the second thickness $t_2$ is less than 30 nm, the current spreading of the semiconductor device 1 will be poor and the forward voltage of the semiconductor device 1 will be high.

The first layer 21 includes a first material and a first dopant. The first material includes multiple elements. The first dopant has a first concentration. The second layer 22 includes a second material and a second dopant. The second material includes multiple elements. The second dopant has a second concentration. One of the elements of the first material of the first layer 21 is different from the elements of the second material of the second layer 22. In one embodiment, to improve emission efficiency, the first material has an energy gap greater than an energy gap of the second material. In one embodiment, the first material includes Group III-V semiconductor material, and the second material includes Group III-V semiconductor material. In one embodiment, the multiple elements of the first material include Al, Ga, and N, and the multiple elements of the second material include Ga and N and is substantially devoid of Al. In the present embodiment, the first material includes $Al_aGa_{1-a}N$, wherein $0<a\leq0.1$, and preferably, $0<a\leq0.05$. The second material includes GaN and is substantially devoid of Al.

In one embodiment, the first concentration of the first dopant of the first layer 21 is greater than the second concentration of the second dopant of the second layer 22. Preferably, a ratio of the first concentration of the first dopant of the first layer 21 to the second concentration of the second dopant of the second layer 22 is not greater than 10, and preferably, not less than 1.1, and more preferably, between 1.2 and 8. The first concentration of the first dopant of the first layer 21 is not less than $1\times10^{18}/cm^3$, and preferably not more than $1\times10^{22}/cm^3$. More preferably, the first concentration of the first dopant of the first layer 21 is between $5\times10^{18}/cm^3$ and $1\times10^{20}/cm^3$ both inclusive. If the first concentration of the first dopant of the first layer 21 is greater than $1\times10^{20}/cm^3$, the forward voltage of the semiconductor device 1 will be high and the emission efficiency of the semiconductor device 1 will also be worse. If the first concentration of the first dopant of the first layer 21 is lower than $1\times10^{18}/cm^3$, the current spreading of the semiconductor device 1 will be poor. The second concentration of the second dopant of the second layer 22 is not less than $1\times10^{18}/cm^3$, and preferably not more than $1\times10^{21}/cm^3$. More preferably, the second concentration of the second dopant of the second layer 22 is between $5\times10^{18}/cm^3$ and $5\times10^{19}/cm^3$ both inclusive. If the second concentration of the second dopant in the second layer 22 is lower than $5\times10^{18}/cm^3$, the electrical static discharge (ESD) tolerance of the semiconductor device 1 will be poor. In the present embodiment, the first dopant of the first layer 21 is the same as the second dopant of the second layer 22. In the present embodiment, the first layer 21 and the second layer 22 are of the same conductivity type. In the present embodiment, the first layer 21 and the second layer 22 are of n-type. In the present embodiment, the first dopant includes, but is not limited to, Si, and the second dopant includes, but is not limited to, Si.

In the present embodiment, since the first electrode 50 is closer to the second layer 22 than it is to the first layer 21, the first material of the first layer 21 includes an element different from the elements of the second material of the second layer 22, and the second concentration of the second dopant of the second layer 22 is lower than the first concentration of the first dopant of the first layer 21, the semiconductor device 1 is with improved emission efficiency and lower forward voltage at the same time.

In one embodiment, to lowering the forward voltage of the semiconductor device 1, the first layer 21 has a third thickness $t_3$ greater than the first thickness $t_1$ of the first portion 221 of the second layer 22. A ratio of the third thickness $t_3$ of the first layer 21 to the first thickness $t_1$ of the first portion 221 is not less than 2, and more preferably, is not more than 10. By controlling the ratio of the third thickness $t_3$ to the first thickness $t_1$, the semiconductor device 1 is with improved current spreading performance. In one embodiment, the third thickness $t_3$ is not less than 500 nm, and preferably, is not more than 3000 nm. Preferably, to further reduce the forward voltage of the semiconductor device 1, the third thickness $t_3$ is between 1000 nm and 2000 nm both inclusive.

Referring to FIG. 1, the second layer 22 includes a sidewall 223 above the second portion 222. From the cross-sectional view of the semiconductor device 1, the sidewall 223 is between the first portion 221 and the first electrode 50. From the cross-sectional view of the semiconductor device 1, to improve the current spreading of the semiconductor device 1, a minimum distance $d_1$ between the sidewall 223 and the first electrode 50 is greater than the second thickness $t_2$. Preferably, to further improve the current spreading of the semiconductor device 1, a ratio of the minimum distance $d_1$ to the second thickness $t_2$ is greater than 10, and preferably, greater than 40, and more preferably, not greater than 200. In one embodiment, to prevent or reduce the leakage current of the semiconductor device 1, the minimum distance $d_1$ between the sidewall 223 and the first electrode 50 is not less than 5000 nm. In one embodiment, the minimum distance $d_1$ between the sidewall 223 and the first electrode 50 is not less than 10000 nm.

Figure 2:
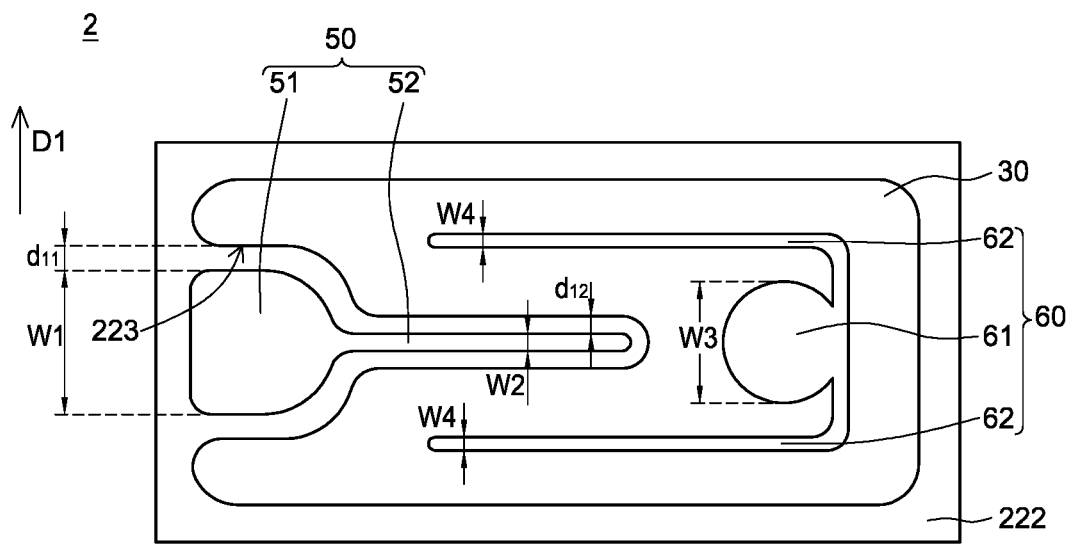
FIG. 2 is a top view of a second embodiment of a semiconductor device.

FIG. 2 is a top view of a second embodiment of a semiconductor device 2. The semiconductor device 2 in accordance with the second embodiment of the present disclosure includes substantially the same structure as that of the first embodiment. The difference between the first embodiment and the second embodiment is described below. In the present embodiment, the first electrode 50 includes a first pad 51 and a first extension part 52 extending from the first pad 51. The first pad 51 has a width $W_1$ along a first direction $D_1$. The first extension part 52 has a width $W_2$ along the first direction $D_1$. The width $W_1$ of the first extension part 52 is less than the width $W_2$ of the first pad 51. A first minimum distance $d_1$ is between the sidewall 223 and the first pad 51. A second minimum distance $d_{12}$ is between the sidewall 223 and the first extension part 52. Preferably, the second minimum distance $d_{12}$ is less than the first minimum distance $d_{11}$. In one embodiment, to prevent or lower the leakage current of the semiconductor device 2, the first minimum distance $d_1$ is not less than 10000 nm, and the second minimum distance $d_{12}$ is not less than 5000 nm. In the present embodiment, the second electrode 60 includes a second pad 61 and two second extension parts 62 extending from the second pad 61. The second pad 61 has a width $W_3$ along the first direction $D_1$. Each of the second extension parts 62 has a width $W_4$ along the first direction $D_1$. The width $W_4$ of each of the second extension parts 62 is less than the width $W_3$ of the second pad 61.

Figure 3:
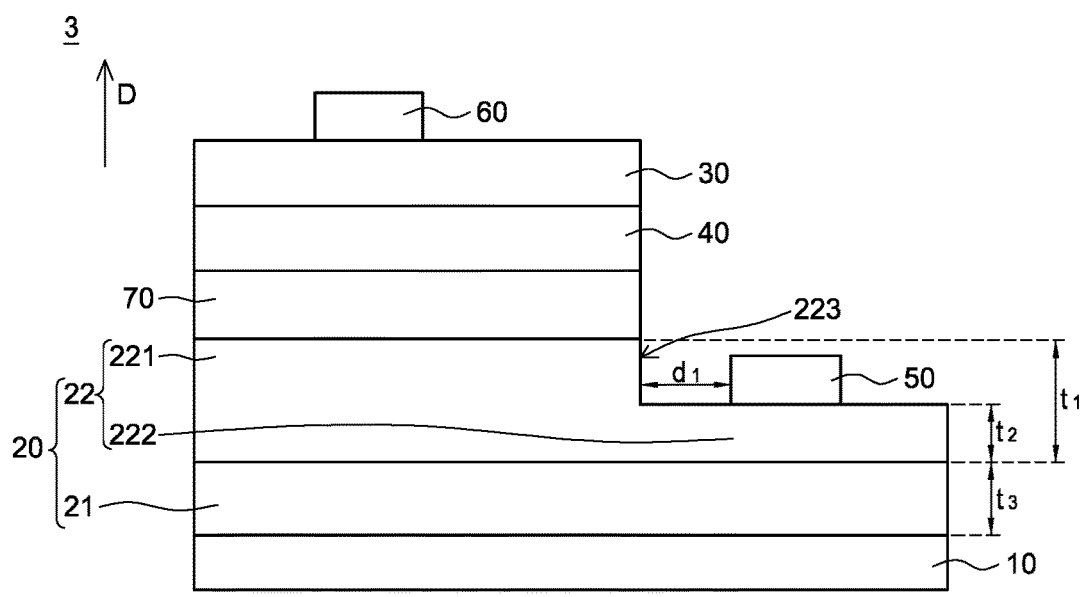
FIG. 3 is a schematic cross-sectional view of a third embodiment of the semiconductor device.

FIG. 3 is a schematic cross-sectional view of a third embodiment of the semiconductor device 3. The semiconductor device 3 in accordance with the third embodiment of the present disclosure includes substantially the same structure as that of the first embodiment. The difference between the first embodiment and the third embodiment is described below. In the present embodiment, the semiconductor device 3 further includes a spacer layer 70 between the second layer 22 and the active region 40. Preferably, the spacer layer 70 includes an energy gap lower than the energy gap of the first layer 21. In one embodiment, the spacer layer 70 includes $In_bAl_cGa_{1-b-c}N$, wherein $0 \le b \le 1$, $0 \le c \le 1$. In one embodiment, the material of the spacer layer 70 is the same as the second material of the second layer 22. In one embodiment, the spacer layer 70 includes GaN. The spacer layer 70 includes a third dopant having a third concentration. In the present embodiment, the third dopant is the same as the second dopant of the second layer 22. In the present embodiment, to further reduce the forward voltage and improve ESD tolerance of the semiconductor device 3, the third concentration of the third dopant of the spacer layer 70 is lower than the second concentration of the second dopant of the second layer 22. In one embodiment, the third concentration of the third dopant of the spacer layer 70 is not less than $1 \times 10^{17}/cm^3$, and preferably, not more than $5 \times 10^{18}/cm^3$. To further reduce the forward voltage of the semiconductor device 3, a ratio of the second concentration of the second dopant of the second layer 22 to the third concentration of the third dopant of the spacer layer 70 is greater than the ratio of the first concentration of the first dopant of the first layer 21 to the second concentration of the second dopant of the second layer 22. Preferably, the ratio of the second concentration of the second dopant of the second layer 22 to the third concentration of the third dopant of the spacer layer 70 is not less than 10, and preferably, not more than 50. To further reduce the forward voltage of the semiconductor device 3, the ratio of the second concentration of the second dopant of the second layer 22 to the third concentration of the third dopant of the spacer layer 70 is at least 3 times, and more preferably, between 5 times and 50 times both inclusive greater than the ratio of the first concentration of the first dopant of the first layer 21 to the second concentration of the second dopant of the second layer 22. In one embodiment, the spacer layer 70 has a fourth thickness less than the third thickness $t_3$ of the first layer 21. Preferably, the fourth thickness is not less than 50 nm, and preferably, not more than 1000 nm, and more preferably, between 100 nm and 500 nm both inclusive. If the fourth thickness is less than 50 nm, the ESD tolerance of the semiconductor device 3 will be worse and the forward voltage of the semiconductor device 3 will be high. In the present embodiment, by including the spacer layer 70, along with the first electrode 50 which is closer to the second layer 22 than the first electrode 50 is to the first layer 21, and the second concentration of the second dopant of the second layer 22 which is lower than the first concentration of the first dopant of the first layer 21, the semiconductor device 3 is with improved emission efficiency, lower forward voltage and better ESD tolerance at the same time.

In a fourth embodiment of the semiconductor device (not shown) of the present disclosure, the semiconductor device in accordance with the fourth embodiment of the present disclosure includes substantially the same structure as that of the third embodiment. The difference between the fourth embodiment and the third embodiment is described below. In the present embodiment, the spacer layer 70 includes a first intermediate layer (not shown) and a second intermediate layer (not shown) on the first intermediate layer, wherein the first intermediate layer includes a dopant having a concentration, the second intermediate layer includes a dopant having a concentration, and the concentration of the dopant of the first intermediate layer is greater than the concentration of the dopant of the second intermediate layer. In the present embodiment, the dopant of the first intermediate layer is the same as the dopant of the second intermediate layer. In the present embodiment, the dopant of the first intermediate layer includes, but is not limited to, Si. The dopant of the second intermediate layer includes, but is not limited to, Si. The concentration of the dopant of the first intermediate layer is not less than $5 \times 10^{17}/cm^3$, and preferably, is not more than $5 \times 10^{18}/cm^3$. The concentration of the dopant of the second intermediate layer is not less than $1 \times 10^{17}/cm^3$, and preferably, is not more than $1 \times 10^{18}/cm^3$. In one embodiment, the material of the first intermediate layer is substantially the same as the material of the second intermediate layer. In the present embodiment, the material of the first intermediate layer and the material of the second intermediate layer include GaN.

Figure 4:
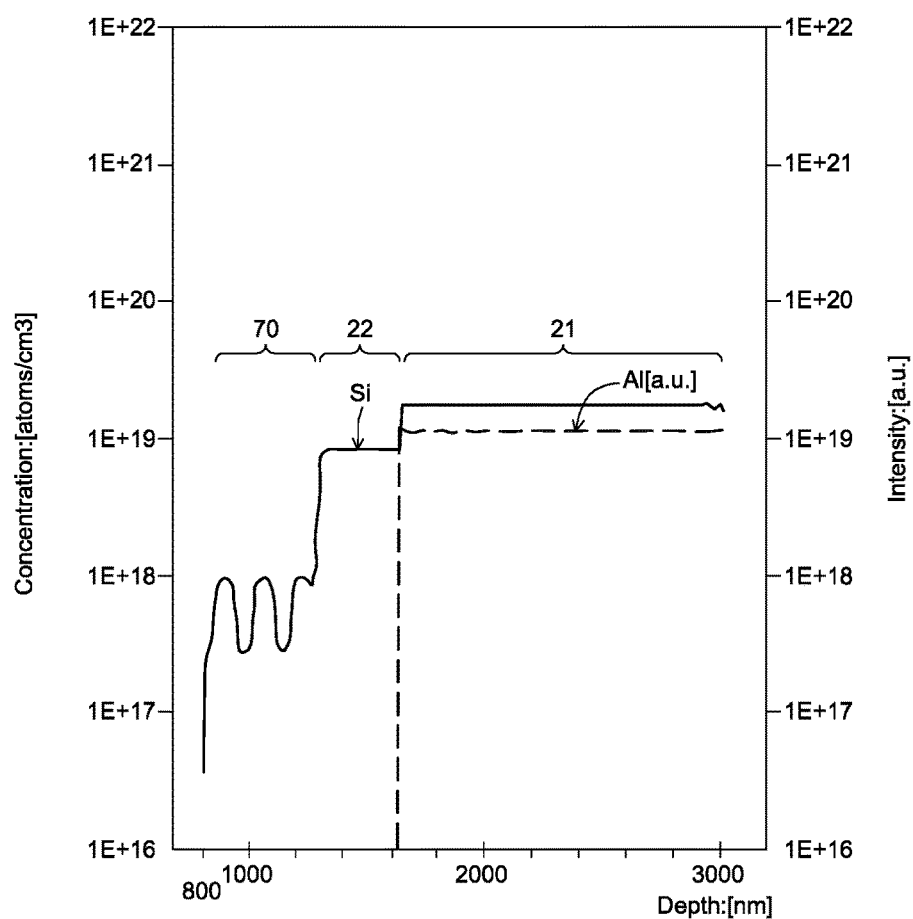
FIG. 4 is a graph showing a relation between the concentration or ion intensity of the elements and the depth in a part of the semiconductor device according to the fifth embodiment of the semiconductor device.

In a fifth embodiment of the semiconductor device (not shown) of the present disclosure, the semiconductor device in accordance with the fifth embodiment of the present disclosure includes substantially the same structure as that of the fourth embodiment. The difference between the fifth embodiment and the fourth embodiment is described below. FIG. 4 is a graph showing a relation between the concentration of element silicon (Si) and ion intensity of element aluminum (Al) and the depth in a part of the semiconductor device according to the fifth embodiment of the semiconductor device of the present disclosure, wherein the relation is determined by secondary ion mass spectrometry (SIMS). Some of the elements of the semiconductor device are not shown in FIG. 4, such as nitrogen (N) and gallium (Ga). In the present embodiment, the spacer layer 70 includes alternating first intermediate layers and second intermediate layers. A single first intermediate layer and a single adjacent second intermediate layer are regarded as a pair. In one embodiment, the pair number of the first intermediate layers and the second intermediate layers is not less than 2, and preferably, is not more than 10. In one embodiment, the first intermediate layer includes a thickness between 15 nm and 40 nm both inclusive. The second intermediate layer includes a thickness between 15 nm and 40 nm both inclusive. Since the spacer layer 70 includes two intermediate layers including dopants with different concentrations, the electrical static discharge (ESD) tolerance of the semiconductor device and the emission efficiency can be further improved at the same time.

Figure 5:
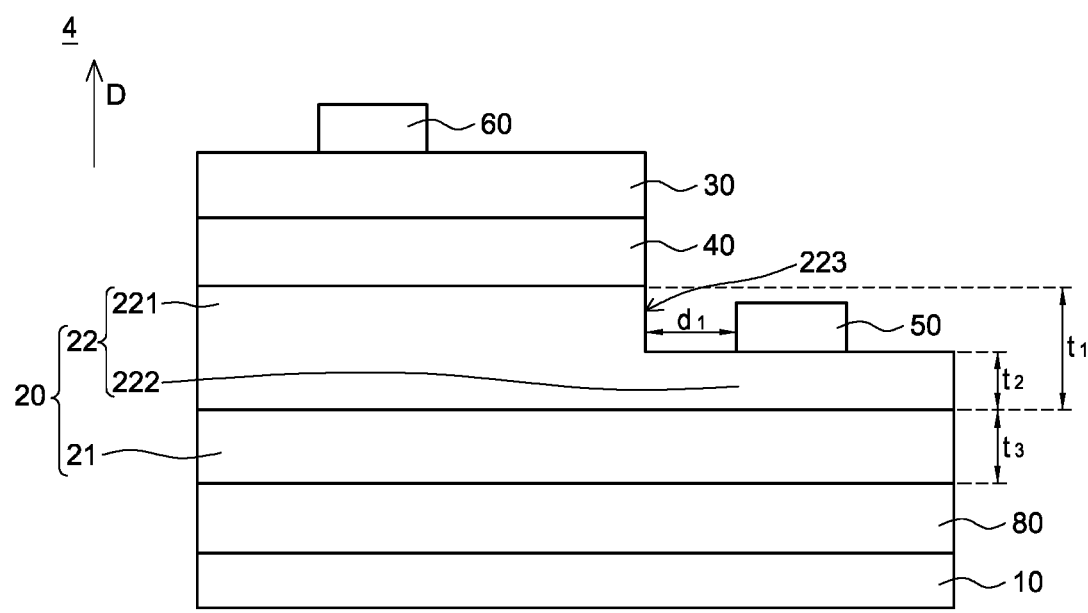
FIG. 5 is a schematic cross-sectional view of a sixth embodiment of the semiconductor device 4 of the present disclosure.

FIG. 5 is a schematic cross-sectional view of a sixth embodiment of the semiconductor device 4. The semiconductor device 4 in accordance with the sixth embodiment of the present disclosure includes substantially the same structure as that of the first embodiment. The difference between the first embodiment and the sixth embodiment is described below. In the present embodiment, the semiconductor device 4 further includes an Al-containing layer 80 under the first semiconductor region 20. The Al-containing layer 80 includes an energy gap greater than the energy gap of the first layer 21. The Al-containing layer 80 can reduce leakage current of the semiconductor device 4. In one embodiment, the Al-containing layer 80 includes $Al_dGa_{1-d}N$, wherein $0<d\leq0.3$, and $a<d$, wherein the first material of the first layer 21 includes $Al_aGa_{1-a}N$. In one embodiment, the Al-containing layer 80 includes a thickness less than the third thickness $t_3$ of the first layer 21. The thickness of the Al-containing layer 80 is not less than 15 nm, and preferably, is not more than 60 nm. In the present embodiment, the Al-containing layer 80 is unintentionally doped.

In the present disclosure, any one of the embodiments of the semiconductor device includes a contact layer including a p-type dopant. Preferably, the concentration of the p-type dopant of the contact layer is not less than $1\times10^{18}/cm^3$, and preferably, not less than $1\times10^{19}/cm^3$, and more preferably, between $1\times10^{19}/cm^3$ and $5\times10^{22}/cm^3$ both inclusive. The material of the contact layer includes a Group III-V semiconductor material, such as $Al_eGa_{1-e}N$, wherein $0\leq e\leq1$. In another embodiment, the contact layer includes GaN. The contact layer has a thickness not more than 15 nm, and preferably, not less than 3 nm.

In the present disclosure, the active region 40 of any one of the embodiments of the semiconductor device includes alternating well layers (not shown) and barrier layers (not shown). Each of the barrier layers has an energy gap. Each of the well layers has an energy gap. In one embodiment, the energy gap of one of the barrier layers is not less than the energy gap of one of the well layers, and preferably, is higher than the energy gap of one of the well layers. Preferably, the energy gap of each of the barrier layers is not less than the energy gap of each of the well layers, and preferably, is higher than the energy gap of each of the well layers. The well layers include Group III-V semiconductor material. In the present embodiment, the well layers include $In_fGa_{1-f}N$, wherein $0<f\leq1$. In another embodiment, the well layers include $Al_gGa_{1-g}N$, wherein $0<g\leq1$, and preferably, $0<g\leq0.4$. The barrier layers include $Al_hGa_{1-h}N$, wherein $0\leq h\leq1$. In one embodiment, $0<h\leq0.6$. In another embodiment, the barrier layers include GaN. Each of the barrier layers has a thickness greater than the thickness of one of the well layers. Preferably, the thickness of each of the barrier layers is greater than the thickness of each of the well layers. Preferably, the thickness of each of the barrier layers is not greater than 15 nm, and not less than 3 nm. The thickness of each of the well layers is not greater than 5 nm, and not less than 1 nm. A single well layer and a single adjacent barrier layer are regarded as a pair. The pair number of the well layers and the barrier layers is not less than 4, and preferably, not more than 15.

In one embodiment, the size of the semiconductor device is 200 μm×480 μm, and the active region 40 of the semiconductor device, such as the active region 40 of the semiconductor device 1 of the first embodiment, has an area of about 92600 μm². The semiconductor device 1 is operated under about 20 mA. The forward voltage of the semiconductor device 1 is about 3.0 V. The current density of the active region 40 is about 0.2 A/mm². In one embodiment, the size of the semiconductor device is 130 μm×240 μm, and the active region 40 of the semiconductor device, such as the active region 40 of the semiconductor device 3, 4, has an area of about 14250 μm². The semiconductor device 3, 4 is operated under a current between 0.1 mA and 5 mA both inclusive, preferably, between 0.1 mA and 2 mA both inclusive, and more preferably, between 0.5 mA and 1 mA both inclusive. The forward voltage of the semiconductor device 3,4 is between 2.6 V and 2.8 V both inclusive. The current density of the active region 40 of the semiconductor device 3,4 is between 0.007 A/mm² and 0.35 A/mm² both inclusive, preferably, between 0.007 A/mm² and 0.14 A/mm² both inclusive, and more preferably, between 0.035 A/mm² and 0.07 A/mm² both inclusive. In one embodiment, the semiconductor device of the present disclosure is operated under a current density between 0.005 A/mm² and 0.6 A/mm² both inclusive, preferably, between 0.005 A/mm² and 0.3 A/mm² both inclusive, and more preferably, between 0.005 A/mm² and 0.1 A/mm² both inclusive.

In the present disclosure, any one of the embodiments of the semiconductor device includes a buffer layer (not shown) between the substrate 10 and the first semiconductor region 20. The buffer layer is for reducing dislocations and improving quality of the layers formed by epitaxial growth thereon. In one embodiment, the buffer layer includes $Al_iGa_{1-i}N$, wherein $0\leq i\leq1$. In one embodiment, the buffer layer includes GaN. In another embodiment, the buffer layer includes AlN. The buffer layer may be formed by physical vapor deposition (PVD) or epitaxy. The PVD includes sputtering or E-gun evaporation.

In the present disclosure, the substrate 10 of the semiconductor device of any one of the embodiments of the semiconductor device has a thickness thick enough for supporting the layers or structures thereon, for example, not less than 50 μm, and more preferably, not more than 300 μm. In one embodiment, the substrate 10 includes sapphire with protrusions periodically formed on a surface thereof. In another embodiment, the substrate 10 includes conductive material including Si, Ge, Cu, Mo, MoW, GaN, ZnO or CuW.

In the present disclosure, the first electrode 50 and the second electrode 60 of any one of the embodiments of the semiconductor device are for electrically connecting to an external power source and for conducting a current therebetween. The material of the first electrode 50 and the second electrode 60 include transparent conductive material or metal material, wherein the transparent conductive material includes transparent conductive oxide including indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO), or indium zinc oxide (IZO). The metal material includes Au, Pt, GeAuNi, Ti, BeAu, GeAu, Al, or ZnAu, Ni.

In one embodiment, the first electrode 50 and the second electrode 60 may be on the two opposite sides of the substrate 10 respectively. In the present embodiment, the substrate 10 may include conductive material.

The method of performing epitaxial growth includes, but is not limited to, metal-organic chemical vapor deposition (MOCVD), hydride vapor phase epitaxy (HVPE), molecular beam epitaxy (MBE), or liquid-phase epitaxy (LPE). Preferably, the method includes MOCVD.

When any one of the embodiments of the semiconductor device of the present disclosure includes a light emitting device, the peak wavelength of the light emitted from the light emitting device is in a visible or invisible range, and preferably, in a blue or ultraviolet range. Preferably, the peak wavelength is between 250 nm and 570 nm both inclusive, and preferably, between 350 nm and 480 nm both inclusive.

In accordance with a further embodiment of the present disclosure, the structures in the embodiments of the present disclosure can be combined or changed. For example, the semiconductor device 3 as shown in FIG. 3 includes the Al-containing layer 80 as shown in FIG. 5.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A semiconductor device, comprising:
    a first semiconductor region comprising a first layer and a second layer on the first layer, wherein the first layer comprises a first dopant comprising a first concentration and the second layer comprises a second dopant comprising a second concentration;
    a second semiconductor region on the first semiconductor region;
    an active region between the second semiconductor region and the second layer;
    a spacer layer between the second layer and the active region, wherein the spacer layer comprises a third dopant comprising a third concentration; and
    a first electrode on the first semiconductor region;
    wherein the third concentration of the third dopant is lower than the second concentration of the second dopant of the second layer, a ratio of the second concentration of the second dopant of the second layer to the third concentration of the third dopant of the spacer layer is greater than the ratio of the first concentration of the first dopant of the first layer to the second concentration of the second dopant of the second layer, and
    wherein the second concentration of the second dopant of the second layer is between $5\times10^{18}/cm^3$ and $5\times10^{19}/cm^3$, the third concentration of the third dopant of the spacer layer is between $1\times10^{17}/cm^3$ and $5\times10^{18}/cm^3$, and a ratio of the second concentration of the second dopant of the second layer to the third concentration of the third dopant of the spacer layer is not less than 10.

2. The semiconductor device according to claim 1, wherein the spacer layer comprises an energy gap lower than the energy gap of the first layer.

3. The semiconductor device according to claim 1, wherein the first layer comprises a third thickness, the spacer layer comprises a fourth thickness less than the third thickness.

4. The semiconductor device according to claim 1,
    wherein the spacer layer comprises a first intermediate layer and a second intermediate layer on the first intermediate layer, and
    wherein a concentration of a dopant of the first intermediate layer is between $5\times10^{17}/cm^3$ and $5\times10^{18}/cm^3$, and a concentration of a dopant of the second intermediate layer is between $1\times10^{17}/cm^3$ and $1\times10^{18}/cm^3$.

5. The semiconductor device according to claim 4, wherein the concentration of the dopant of the first intermediate layer is greater than the concentration of the dopant of the second intermediate layer.

6. The semiconductor device according to claim 4, wherein the first concentration of the first dopant of the first layer is greater than the concentration of the dopant of the first intermediate layer.

7. The semiconductor device according to claim 1, wherein a ratio of the second concentration of the second dopant of the second layer to the third concentration of the third dopant of the spacer layer is not less than 3 times greater than the ratio of the first concentration of the first dopant of the first layer to the second concentration of the second dopant of the second layer.

8. The semiconductor device according to claim 1, wherein the first concentration of the first dopant of the first layer is between $1\times10^{18}/cm^3$ and $1\times10^{20}/cm^3$, a ratio of the first concentration of the first dopant of the first layer to the second concentration of the second dopant of the second layer is not greater than 10.

9. The semiconductor device according to claim 1, further comprising an Al-containing layer under the first semiconductor region, wherein the Al-containing layer comprises an energy gap, the first layer comprises an energy gap, the energy gap of the Al-containing layer is greater than the energy gap of the first layer.

10. The semiconductor device according to claim 1, wherein the second layer comprises a sidewall facing the first electrode, the first electrode comprises a first pad and a first extension part extending from the first pad, the sidewall and the first pad have a first minimum distance therebetween, the sidewall and the first extension part have a second minimum distance therebetween, and the second minimum distance is less than the first minimum distance.

11. The semiconductor device according to claim 10, wherein the second layer comprises a second portion located below and contacting the first electrode, the second portion have a second thickness, and the side wall of the second layer and the first electrode have a minimum distance therebetween greater than the second thickness of the second portion.

12. The semiconductor device according to claim 11, wherein a ratio of the minimum distance to the second thickness is greater than 10.

13. A semiconductor device, comprising:
    a first semiconductor region comprising a first layer and a second layer on the first layer, wherein the first layer comprises a first dopant comprising a first concentration and the second layer comprises a second dopant comprising a second concentration;

a second semiconductor region on the first semiconductor region;

an active region between the second semiconductor region and the second layer;

a spacer layer between the second layer and the active region wherein the spacer layer comprises a first intermediate layer and a second intermediate layer on the first intermediate layer, the first intermediate layer comprises a dopant having a concentration, the second intermediate layer comprises a dopant having a concentration, and the concentration of the dopant of the first intermediate layer is greater than the concentration of the dopant of the second intermediate layer; and a first electrode on the first semiconductor region.

14. The semiconductor device according to claim 13, wherein the first concentration is greater than the concentration of the dopant of the first intermediate layer.

15. The semiconductor device according to claim 13, wherein the first layer comprises a third thickness, the spacer layer comprises a fourth thickness less than the third thickness.

16. The semiconductor device according to claim 13, wherein the first concentration of the first dopant of the first layer is between $1\times10^{18}/cm^3$ and $1\times10^{20}/cm^3$, and a ratio of the first concentration of the first dopant of the first layer to the second concentration of the second dopant of the second layer is not greater than 10.

17. The semiconductor device according to claim 13, wherein the second layer comprises a first portion overlapped with the active region in a stacking direction and has a first thickness, a ratio of the third thickness of the first layer to the first thickness of the first portion is not less than 2.

18. The semiconductor device according to claim 13, wherein the second layer comprises a sidewall facing the first electrode, the first electrode comprises a first pad and a first extension part extending from the first pad, the sidewall and the first pad have a first minimum distance therebetween, the sidewall and the first extension part have a second minimum distance therebetween, and the second minimum distance is less than the first minimum distance.

19. The semiconductor device according to claim 18, wherein the second layer comprises a second portion located below and contacting the first electrode, the second portion have a second thickness, and the side wall of the second layer and the first electrode have a minimum distance therebetween greater than the second thickness of the second portion.

20. The semiconductor device according to claim 13, wherein the concentration of the dopant of the first intermediate layer is between $5\times10^{17}/cm^3$ and $5\times10^{18}/cm^3$, and the concentration of the dopant of the second intermediate layer is between $1\times10^{17}/cm^3$ and $1\times10^{18}/cm^3$.

* * * * *